United States Patent
Lee

(10) Patent No.: US 11,894,297 B2
(45) Date of Patent: Feb. 6, 2024

(54) METAL-INSULATOR-METAL CAPACITOR HAVING ELECTRODES WITH INCREASING THICKNESS

(71) Applicant: Taiwan Semiconductor Manufacturing Company, Ltd., Hsinchu (TW)

(72) Inventor: I-Che Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/389,273

(22) Filed: Jul. 29, 2021

(65) Prior Publication Data
US 2023/0030826 A1    Feb. 2, 2023

(51) Int. Cl.
*H01L 23/522*    (2006.01)
*H01L 49/02*     (2006.01)
*H01L 27/08*     (2006.01)

(52) U.S. Cl.
CPC ...... *H01L 23/5223* (2013.01); *H01L 27/0805* (2013.01); *H01L 28/60* (2013.01)

(58) Field of Classification Search
CPC .. H01L 23/5223; H01L 27/0805; H01L 28/60
See application file for complete search history.

(56) References Cited

U.S. PATENT DOCUMENTS

| | | | | |
|---|---|---|---|---|
| 5,699,291 A | * | 12/1997 | Tsunemine | H10B 12/033 257/296 |
| 2003/0170962 A1 | * | 9/2003 | Yasuda | H01L 27/0805 257/E27.048 |
| 2006/0289917 A1 | * | 12/2006 | Fujiwara | H01L 28/91 257/296 |
| 2009/0294902 A1 | * | 12/2009 | Yoshimura | H01G 4/33 257/532 |
| 2010/0224960 A1 | * | 9/2010 | Fischer | H01L 28/86 257/532 |
| 2013/0270675 A1 | * | 10/2013 | Childs | H01L 28/60 257/532 |
| 2015/0357400 A1 | * | 12/2015 | Furuhashi | H01L 27/14636 257/533 |
| 2016/0104762 A1 | * | 4/2016 | Triyoso | H01L 28/60 257/532 |
| 2019/0123121 A1 | * | 4/2019 | Liu | H01L 21/0274 |
| 2020/0111921 A1 | * | 4/2020 | Li | H01L 23/5223 |

* cited by examiner

*Primary Examiner* — Peter Bradford
(74) *Attorney, Agent, or Firm* — JCIPRNET

(57) ABSTRACT

Disclosed are metal-insulator-metal capacitors and integrated chips. In one embodiment, a metal-insulator-metal capacitor includes N electrodes and (N−1) passivation layers, wherein the N electrodes and the (N−1) passivation layers are alternately stacked on a substrate. N is an integer larger than 1. Thicknesses of the N electrodes gradually increase in a direction parallel to a normal direction of the substrate.

20 Claims, 3 Drawing Sheets

METAL-INSULATOR-METAL CAPACITOR HAVING ELECTRODES WITH INCREASING THICKNESS

BACKGROUND

Modern day integrated chips comprise millions or billions of transistor devices, which are configured to enable logical functionality for an integrated chip (e.g., form a processor configured to perform logic functions). Often integrated chips may also comprise passive devices, such as capacitors, resistors, inductors, varactors, etc. Metal-insulator-metal (MIM) capacitors are a common type of passive device that is often integrated into the back-end-of-the-line (BEOL) metal interconnect layers of integrated chips. For example, MIM capacitors may be used as decoupling capacitors configured to mitigate power supply or switching noise (e.g., switching of input/output (I/O) and core circuits) caused by changes in current flowing through various parasitic inductances associated with an integrated chip and a package in which the integrated chip is located.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
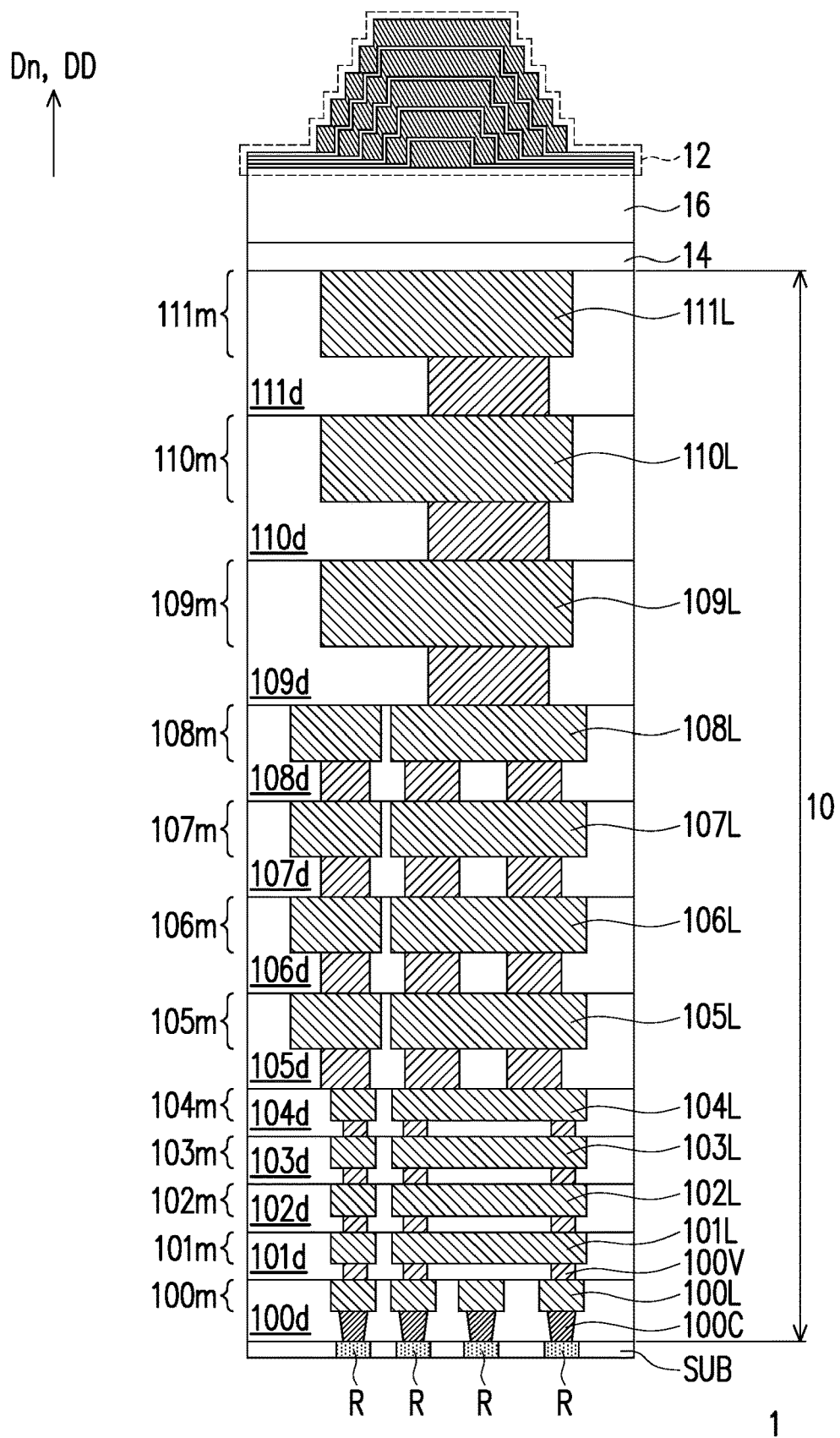
FIG. 1 schematically illustrates a partial cross-sectional view of an integrated chip in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, it will be understood that when an element is referred to as being "connected to" or "coupled to" another element, it may be directly connected to or coupled to the other element, or one or more intervening elements may be present. Further, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
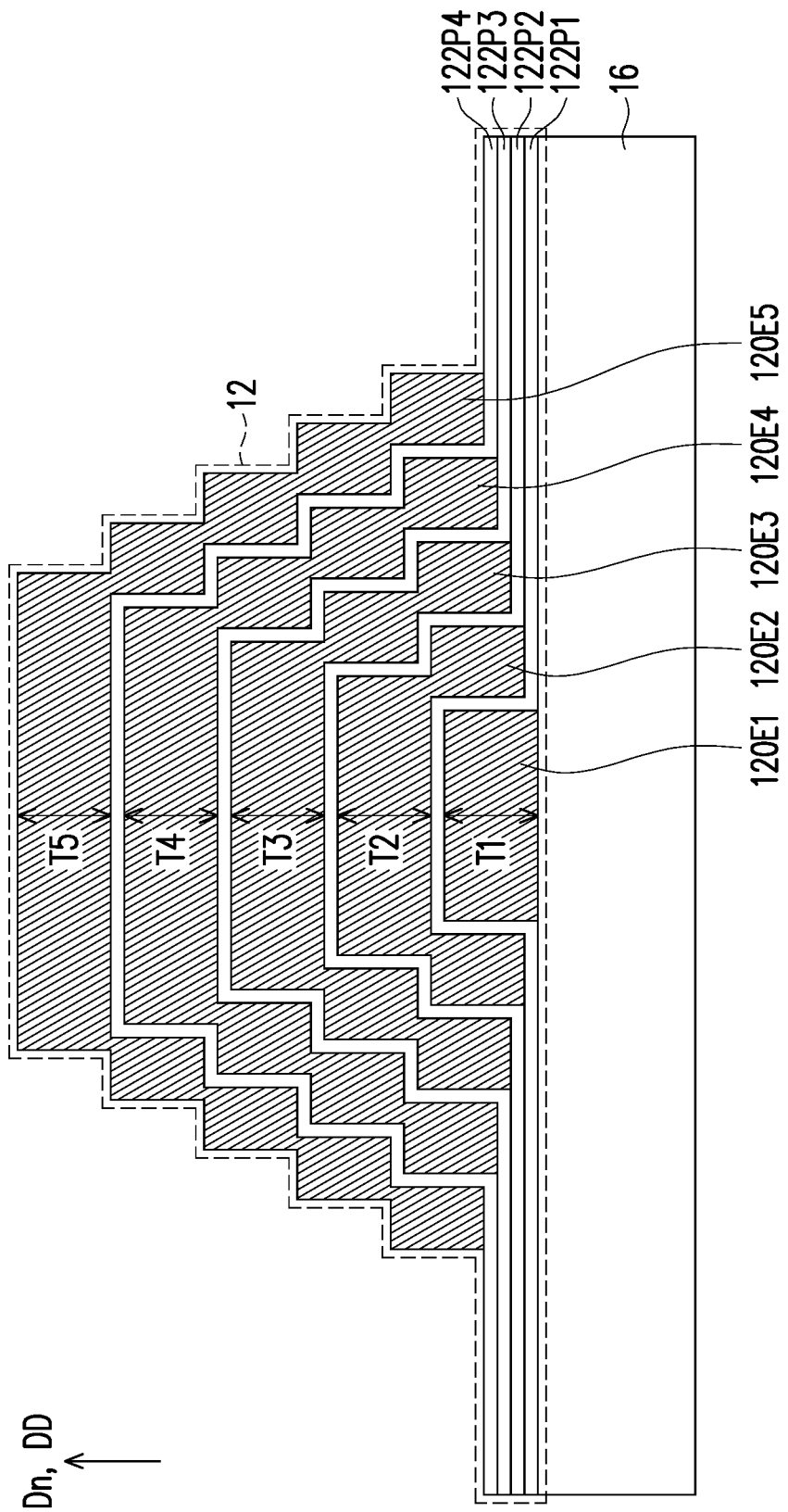
FIG. 2 schematically illustrates an enlarged view of the metal-insulator-metal (MIM) capacitor in FIG. 1.

FIG. 1 schematically illustrates a partial cross-sectional view of an integrated chip 1 in accordance with some embodiments of the present disclosure. FIG. 2 schematically illustrates an enlarged view of the metal-insulator-metal (MIM) capacitor 12 in FIG. 1.

Referring to FIG. 1 and FIG. 2, an integrated chip 1 may include an interconnect structure 10 overlying a substrate SUB and a metal-insulator-metal capacitor 12 disposed on the interconnect structure 10 in accordance with some embodiments of the present disclosure. However, one or more elements or layers may be integrated into the integrated chip 1 according to different needs. In some embodiments, as shown in FIG. 1, the integrated chip 1 may further include a passivation layer 14 and a passivation layer 16 sequentially stacked on the interconnect structure 10 and disposed between the interconnect structure 10 and the metal-insulator-metal capacitor 12.

In some embodiments, the substrate SUB may be a semiconductor substrate, such as a bulk semiconductor, a semiconductor-on-insulator (SOI) substrate, or the like, which may be doped (e.g., with a p-type or an n-type dopant) or undoped. The substrate SUB may be an integrated circuit die, such as a logic die, a memory die, an ASIC die, or the like. The substrate SUB may be a complementary metal oxide semiconductor (CMOS) die and may be referred to as a CMOS under array (CUA). The substrate SUB may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate SUB may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, circuits (not shown) may be formed over the substrate SUB. The circuits may include active devices (e.g., transistors, diodes or the like), passive devices (e.g., capacitors, resistors, or the like) and/or the interconnect structure 10. The active devices may be located at a top surface of the substrate SUB. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

In some embodiments, the substrate SUB includes one or more shallow trench isolation (STI) regions (not shown), which may include a dielectric-filled trench within the substrate SUB. In some embodiments, access transistor (not shown) is disposed between the STI regions. In some embodiments, the access transistor may be, for example, an insulated gate field-effect transistor (IGFET) or some other suitable transistor.

In some embodiments, the access transistor includes access gate electrode (not shown), access gate dielectric (not shown), access sidewall spacers (not shown), and source/drain regions R. The access gate electrode overlies the access gate dielectric and is sandwiched between the source/drain regions R. The access sidewall spacers are on sidewalls of the access gate electrode and sidewalls of the access gate dielectric. The source/drain regions R are disposed within the substrate SUB between the access gate electrode and the STI regions, and are doped to have a first conductivity type which is opposite to a second conductivity type of a channel region under the access gate dielectric. In some embodiments, the access gate electrode may be, for example, doped polysilicon, a silicide, or a metal, such as tungsten, titanium, or combinations thereof. In some embodiments, the access gate dielectric may be, for example, an oxide, such as silicon dioxide, or a high-κ dielectric material. In some embodiments, the access sidewall spacers 422 may be made, for example, of silicon nitride (e.g., $Si_3N_4$).

The interconnect structure 10 is disposed on the substrate SUB and couples devices to one another. For example, the access transistor and the MIM capacitor 12 is electrically connected to each other through the interconnect structure 10. In some embodiments, the interconnect structure 10 includes a plurality of inter-metal dielectric (IMD) layers 100d to 111d and a plurality of metallization layers 100m to 111m, wherein the IMD layers 100d to 111d and the metallization layers 100m to 111m are layered over one another in alternating fashion.

In some embodiments, the IMD layers 100d to 111d may be made, for example, of un-doped silicate glass, an oxide (e.g., silicon dioxide ($SiO_2$)), an oxy-nitride (e.g., silicon oxy-nitride (SiON)), doped silicon dioxide (e.g., carbon doped silicon dioxide), borosilicate glass (BSG), phosphoric silicate glass (PSG), borophosphosilicate glass (BPSG), fluorinated silicate glass (FSG), a low-k dielectric material, an extreme low K dielectric layer, or the like.

In some embodiments, the metallization layers 100m to 111m include metal lines 100L to 111L, which are formed within trenches. The metal lines 100L to 111L may be power, ground, and/or signal lines for the active devices on the substrate SUB. In some embodiments, the metallization layers 100m to 111m may be made of conductive materials such as aluminum, copper, aluminum alloy, copper alloy, aluminum/silicon/copper alloy, titanium, titanium nitride, tantalum, tantalum nitride, tungsten, gold (Au), silver (Ag), polysilicon, metal silicide, some other conductive material, or a combination of the foregoing. It should be noted that the number of each of the IMD layers and the metallization layers, the shape of each of the IMD layers and the metallization layers, the relative position between the IMD layers and the metallization layers may be changed according to different design, and should not be limited to those shown in FIG. 1.

In some embodiments, contacts 100C may be formed in the IMD layer 100d and extend from the metallization layer 100m closest to the substrate SUB to the source/drain regions R and/or access gate electrode. In some embodiments, the contacts 100C may be made of conductive materials such as aluminum, copper, aluminum alloy, copper alloy, aluminum/silicon/copper alloy, titanium, titanium nitride, tantalum, tantalum nitride, tungsten, gold (Au), silver (Ag), polysilicon, metal silicide, some other conductive material, or a combination of the foregoing. The metal lines 100L to 111L and the contacts 100C may be made of the same material. Alternatively, the metal lines 100L to 111L and the contacts 100C may be made of different materials.

In some embodiments, vias 100V may be formed in the IMD layers 100d to 111d and extend between two adjacent metallization layers. For example, one or more vias 100V extend between metallization layers 100m and 101m, between metallization layers 101m and 102m, between metallization layers 102m and 103m, between metallization layers 103m and 104m, between metallization layers 104m and 105m, between metallization layers 105m and 106m, between metallization layers 106m and 107m, between metallization layers 107m and 108m, between metallization layers 108m and 109m, between metallization layers 109m and 110m, and between metallization layers 110m and 111m. The vias 100V may be made of conductive materials such as aluminum, copper, aluminum alloy, copper alloy, aluminum/silicon/copper alloy, titanium, titanium nitride, tantalum, tantalum nitride, tungsten, gold (Au), silver (Ag), polysilicon, metal silicide, some other conductive material, or a combination of the foregoing. The metal lines 100L to 111L, the contacts 100C, and the vias 100V may be made of the same material. Alternatively, the metal lines 100L to 111L, the contacts 100C, and the vias 100V may be made of different materials.

In some embodiments, the metal lines 100L to 111L, the contacts 100C, and the vias 100V may be formed by a damascene process, a combination of deposition, lithography, and etch process, or combinations thereof. In some embodiments, the interconnect structure 10 may include more conductive features (e.g., the conductive lines, the contacts, the vias, or a combination thereof).

The passivation layer 14 is disposed on the interconnect structure 10 and located between the interconnect structure 10 and the passivation layer 16. The passivation layer 16 is disposed on the passivation layer 14 and located between the passivation layer 14 and the metal-insulator-metal capacitor 12. In some embodiments, the passivation layer 14 and the passivation layer 16 have different materials than the one or more IMD layers. In some embodiments, the passivation layer 14 may be made of silicon carbon nitride (SiCN), for example. In some embodiments, the passivation layer 16 may be made of a nitride (e.g., SiN), an oxy-nitride (e.g., silicon oxynitride (SiON)), a carbide (e.g., silicon carbide (SiC)), or the like, for example.

Figure 3:
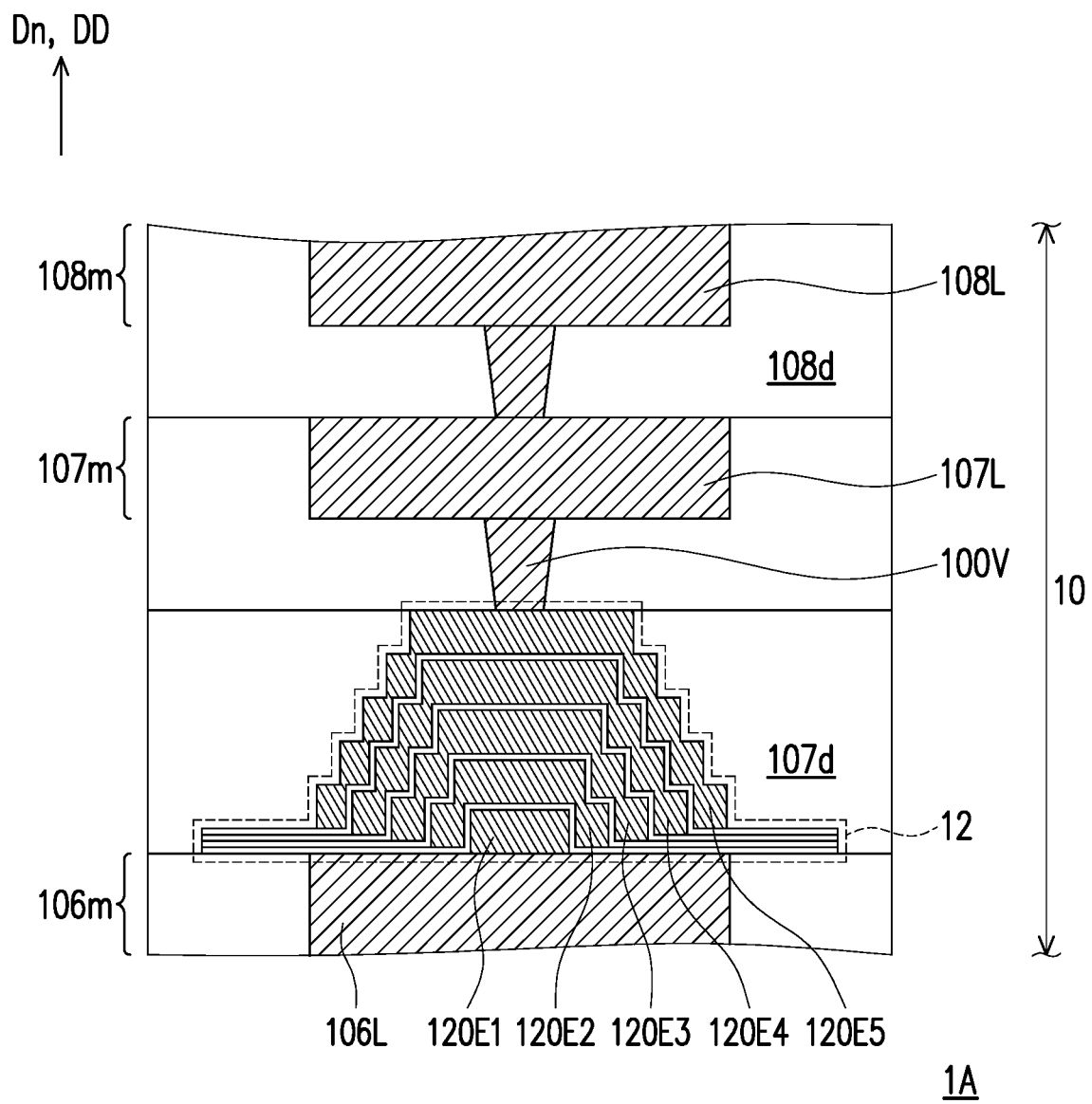
FIG. 3 schematically illustrates a partial cross-sectional view of an integrated chip in accordance with some embodiments of the present disclosure.

The metal-insulator-metal capacitor 12 includes N electrodes (e.g., electrodes 120E1 to 120E5) and (N−1) passivation layers (e.g., passivation layers 122P1 to 122P4), wherein the N electrodes and the (N−1) passivation layers are alternately stacked on the substrate SUB. In some embodiments, as shown in FIG. 1, the metal-insulator-metal capacitor 12 is disposed on the interconnect structure 10, and the N electrodes and the (N−1) passivation layers are alternately stacked on the interconnect structure 10. In other embodiments, as shown in FIG. 3, the metal-insulator-metal capacitor 12 is integrated into the interconnect structure 10, and the N electrodes and the (N−1) passivation layers are alternately stacked in the interconnect structure 10.

N is an integer larger than 1. In FIG. 1 to FIG. 3, N is 5, for example. In other words, the metal-insulator-metal capacitor 12 includes five electrodes (e.g., electrodes 120E1 to 120E5) and four passivation layers (e.g., passivation layers 122P1 to 122P4). However, the number of electrodes and passivation layers in the metal-insulator-metal capacitor may be changed according to needs. In general, N may be 2 to 10. However, N may be larger than 10 if needed.

In some embodiments, although not shown, N is 2. Under this design, the metal-insulator-metal capacitor includes a first electrode (also referred to as "top electrode"), a second electrode (also referred to as "bottom electrode") located between the top electrode and the substrate, and a passivation layer located between the top electrode and the bottom electrode. It should be noted that terms such as "first" and "second" mentioned throughout the specification or the claims of this application are only for naming the names of the elements or distinguishing different embodiments or scopes and are not intended to limit the upper limit or the lower limit of the number of the elements nor intended to limit manufacturing sequences or disposition sequences of the elements. The passivation layer overlying the bottom electrode may have a step region that continuously contacts and extends from a top surface of the bottom electrode to sidewalls of the bottom electrode. Similarly, the top electrode overlying the passivation layer may have a step region that continuously contacts and extends from a top surface of the passivation layer to sidewalls of the passivation layer.

In some embodiments, although not shown, N is 3. Under this design, the metal-insulator-metal capacitor includes a top electrode, a bottom electrode located between the top electrode and the substrate, a middle electrode located between the top electrode and the bottom electrode, a first passivation layer located between the top electrode and the middle electrode, and a second passivation layer located between the middle electrode and the bottom electrode. The second passivation layer overlying the bottom electrode may have a step region that continuously contacts and extends from a top surface of the bottom electrode to sidewalls of the bottom electrode. Similarly, the middle electrode overlying the second passivation layer may have a step region that continuously contacts and extends from a top surface of the second passivation layer to sidewalls of the second passivation layer. The first passivation layer overlying the middle electrode may have step regions that continuously contacts and extends from top surfaces (surfaces perpendicular to a normal direction Dn of the substrate SUB and connected by sidewalls) of the middle electrode to sidewalls of the middle electrode. The top electrode overlying the first passivation layer may have step regions that continuously contacts and extends from top surfaces of the first passivation layer to sidewalls of the first passivation layer. The bottom electrode, the second passivation layer, and the middle electrode form a MIM capacitor. The middle electrode, the first passivation layer, and the top electrode form another MIM capacitor, and the two MIM capacitors are electrically connected in series.

The larger the N, the more MIM capacitors connected in series. The configuration of the metal-insulator-metal capacitor when N is larger than 3 can be deduced by the above description and will not be repeated below.

In some embodiments, the electrodes (e.g., electrodes 120E1 to 120E5) may be deposited and/or grown by electroless plating, electroplating, or another suitable deposition process and then patterned by patterning processes (e.g., lithography and etching processes). Specifically, the method for forming each of the electrodes (e.g., electrodes 120E1 to 120E5) includes forming the material of electrode on the interconnect structure 10 followed by patterning the electrode material to form the electrode.

Take the electrode 120E1 as an example, a conductive material layer (not shown) is formed on the passivation layer 16 by electroless plating, electroplating, or another suitable deposition process. Then, a patterned mask layer (not shown; e.g., positive/negative photoresist, a hardmask, etc.) is formed on the conductive material layer. In some embodiments, the patterned mask layer may be formed by forming a mask material layer (not shown) on the conductive material layer (e.g., via a spin-on process), exposing the mask material layer to a pattern (e.g., via a lithography process, such as photolithography, extreme ultraviolet lithography, or the like), and developing the mask material layer to form the patterned mask layer. After the patterned mask layer is formed on the conductive material layer, an etching process is performed to selectively etch the conductive material layer according to the patterned mask layer. In some embodiments, the etching process removes unmasked portions of the conductive material layer to form the electrode 120E1. In some embodiments, the etching process may be, for example, a wet etching process, a dry etching process (e.g., a reactive ion etching (RIE) process, a neutral beam etch (NBE) process, or the like), some other etching process, or a combination of the foregoing. The method for forming other electrodes (e.g., the electrodes 120E2 to 120E5) can be referred to the above, which will not be repeated here.

In some embodiments, materials of the electrodes (e.g., electrodes 120E1 to 120E5) include copper, galvanized iron, lead, nickel, nickel-chromium, zinc, aluminum, platinum, gold, ruthenium, copper alloy, graphite, calcium, cesium carbonate, lithium fluoride, molybdenum (VI) oxide, silver, carbon, palladium, tin, titanium, vanadium, chromium, manganese, cobalt, gallium, indium, scandium, mixed metal oxide, titanium nitride, tantalum nitride, thallium, doped silicon, poly silicon, germanium, antimony, tungsten, hafnium, iridium, alloys of these, combinations thereof, or the like.

In some embodiments, the passivation layers (e.g., passivation layers 122P1 to 122P4) may be deposited and/or grown by chemical vapor deposition (CVD), physical vapor deposition (PVD), plasma-enhanced chemical vapor deposition (PECVD), atomic layer deposition (ALD), thermal oxidation, or another suitable deposition process. In some embodiments, materials of the passivation layers (e.g., passivation layers 122P1 to 122P4) include silicon nitride (e.g. $Si_3N_4$), ceramic, metal oxide (e.g. $ZrO_2$, $Al_2O_3$, $HfO_2$, $HfZrO$, $Ta_2O_5$), aluminum nitride, lead zirconate titanate, carbide, silicon dioxide, nitride, some other dielectric material, any combination of the foregoing, or the like. The dielectric material may include high-k dielectric (e.g., a dielectric material having a dielectric constant greater than about 3.9 or some other suitable value). In some embodiments, each of the passivation layers (e.g., passivation layers 122P1 to 122P4) may be a single layer. Alternatively, each of the passivation layers (e.g., passivation layers 122P1 to 122P4) may be a stacked layer of multiple dielectric layers.

Referring to FIG. 2, thicknesses (e.g., thicknesses T1 to T5) of the N electrodes (e.g., electrodes 120E1 to 120E5) gradually increase in a direction DD parallel to the normal direction Dn of the substrate SUB. FIG. 2 illustrates that the thicknesses of the N electrodes gradually increase in the direction DD same as the normal direction Dn of the substrate SUB. In other words, the thicknesses of the N electrodes gradually increase in the normal direction Dn of the substrate SUB. However, in other embodiments not shown, the thicknesses of the N electrodes gradually increase in the direction DD opposite to the normal direction Dn of the substrate SUB. In other words, the thicknesses of the N electrodes gradually decrease in the normal direction Dn of the substrate SUB.

In some embodiments, the thicknesses (e.g., thicknesses T1 to T5) of the N electrodes (e.g., electrodes 120E1 to 120E5) are 10 nm to 100 nm, i.e., 10 nm≤T1≤100 nm, 10 nm≤T2≤100 nm, 10 nm≤T3≤100 nm, 10 nm≤T4≤100 nm, and 10 nm≤T5≤100 nm. In some embodiments, the thicknesses (e.g., thicknesses T1 to T5) of the N electrodes (e.g., electrodes 120E1 to 120E5) are all different. For example, the thicknesses T1 to T5 are 10 nm, 15 nm, 20 nm, 25 nm, and 30 nm, respectively. Alternatively, the thicknesses T1 to T5 are 10 nm, 12 nm, 14 nm, 16 nm, and 18 nm, respectively. In other embodiments, two most distant electrodes (e.g., electrodes 120E1 and 120E5) among the N electrodes have different thicknesses (i.e., T1≠T5), and at least two adjacent electrodes among the N electrodes have the same thickness. For example, the thicknesses T1 to T5 are 15 nm, 15 nm, 20 nm, 20 nm, and 25 nm, respectively. Alternatively, the thicknesses T1 to T5 are 10 nm, 15 nm, 15 nm, 20 nm, and 20 nm, respectively. Alternatively, the thicknesses T1 to T5 are 10 nm, 15 nm, 15 nm, 20 nm, and 25 nm, respectively. It should be understood that the above-mentioned numerical values are only examples, and are not used to limit the present disclosure. In some embodiments, the thicknesses of the passivation layers are smaller than the thicknesses of the electrodes. In some embodiments, the thicknesses of the passivation layers are the same, but not limited thereto.

In the integrated chip 1, the total volume or thickness of the metal-insulator-metal capacitor 12 can be reduced by making the thickness of the lower electrode smaller than the thickness of the upper electrode or making the thickness of the upper electrode smaller than the thickness of the lower electrode, so more capacitors or other components can be integrated onto the interconnect structure 10, or the integrated chip 1 can be scaled down.

In the embodiments that the thicknesses of the N electrodes gradually increase in the normal direction Dn of the substrate SUB, the lower the electrode, the smaller the thickness. In this case, it is easier to make the passivation layer conformal with the electrode underneath, and/or electrode broken or thinning on the sidewall of the passivation layer can be improved. Therefore, the reliability or performance of the metal-insulator-metal capacitor can be improved. For example, the resistance problem can be improved, high breakdown voltage can be achieved, long time dependent dielectric breakdown (TDDB) can be achieved, and/or leakage performance (e.g., reduce leakage current) of the MIM capacitor (e.g., by reducing the likelihood that one or more electrons tunnels through the capacitor insulator structure) can be improved. As such, the metal-insulator-metal capacitor can achieve high performance in, for example, surge suppression, element coupling, power conditioning, and/or energy storage, but not limited thereto.

In other embodiments, although not shown, the integrated chip 1 may further include a protection layer disposed over the MIM capacitor 12 and a metal protection frame disposed atop the protection layer to provide protection for the MIM capacitor 12 from the operational environment such as a wet, damp, or humid environment, but not limited thereto. In some embodiments, the protection layer may, for example, be or comprise silicon nitride (e.g. $Si_3N_4$), ceramic, metal oxide, carbide, silicon dioxide, nitride, or the like. In some embodiments, the metal frame may, for example, be or comprise copper, galvanized iron, lead, nickel, nickel-chromium, zinc, aluminum, platinum, gold, ruthenium, copper alloy, graphite, calcium, cesium carbonate, lithium fluoride, molybdenum (VI) oxide, silver, carbon, palladium, tin, titanium, vanadium, chromium, manganese, cobalt, gallium, indium, scandium, mixed metal oxide, titanium nitride, tantalum nitride, thallium, doped silicon, poly silicon, germanium, antimony, tungsten, hafnium, iridium, alloys of these, combinations thereof, or the like.

FIG. 3 schematically illustrates a partial cross-sectional view of an integrated chip 1A in accordance with some embodiments of the present disclosure.

Referring to FIG. 3, an integrated chip 1A may include an interconnect structure (e.g., the interconnect structure 10) overlying a substrate (not shown in FIG. 3, e.g., the substrate SUB in FIG. 1) and a metal-insulator-metal capacitor (e.g., the metal-insulator-metal capacitor 12) disposed in the interconnect structure 10 in accordance with some embodiments of the present disclosure. The metal-insulator-metal capacitor 12 and layers or elements adjacent to the metal-insulator-metal capacitor 12 are illustrated in FIG. 3, while layers or elements away from the metal-insulator-metal capacitor 12 are not illustrated in FIG. 3 for clarity. However, it should be understood that the integrated chip 1A may include one or more elements or layers described or not described above according to different needs. For ease of illustration, the interconnect structure in the integrated chip 1A adopts the interconnect structure 10 in FIG. 1. However, the interconnect structure in the integrated chip 1A may be different from the interconnect structure 10 in FIG. 1 in accordance with some other embodiments of the present disclosure.

In some embodiments, the metal-insulator-metal capacitor 12 in the interconnect structure 10 may be used as decoupling capacitors configured to mitigate power supply or switching noise (e.g., switching of input/output (I/O) and core circuits) caused by changes in current flowing through various parasitic inductances associated with the integrated chip 1A and a package (not shown) in which the integrated chip 1A is located. However, the function or application of the metal-insulator-metal capacitor 12 is not limited thereto.

In some embodiments, the metal-insulator-metal capacitor 12 is disposed on the metallization layer 106m, wherein the electrode 120E1 of the metal-insulator-metal capacitor 12 contacts the metal line 106L, and the electrode 120E5 of the metal-insulator-metal capacitor 12 contacts the via 100V that is located between the metallization layer 106m and the metallization layer 107m.

However, it should be noted that the configuration of the metal-insulator-metal capacitor (such as the number of the electrodes and the number of the passivation layers, or the shape of each layer in the metal-insulator-metal capacitor) integrated into the interconnect structure, the position of the metal-insulator-metal capacitor in the interconnect structure, or the electrical connection between the metal-insulator-metal capacitor and the interconnect structure can be changed according to needs. For example, in other embodiments, although not shown, the metal-insulator-metal capacitor may be disposed on the metallization layer 101m (see FIG. 1), wherein the electrode 120E1 of the metal-insulator-metal capacitor 12 contacts the metal line 101L, and the electrode 120E5 of the metal-insulator-metal capacitor 12 contacts the via 100V that is located between the metallization layer 101m and the metallization layer 102m, but not limited thereto.

In the integrated chip 1A, the total volume or thickness of the metal-insulator-metal capacitor 12 can be reduced by making the thickness of the lower electrode smaller than the thickness of the upper electrode or making the thickness of the upper electrode smaller than the thickness of the lower electrode, so more capacitors or other components can be integrated into the interconnect structure 10, or the integrated chip 1A can be scaled down.

In the embodiments that the thicknesses of the N electrodes gradually increase in the normal direction Dn of the substrate SUB, the lower the electrode, the smaller the thickness. In this case, it is easier to make the passivation layer conformal with the electrode underneath, and/or electrode broken or thinning on the sidewall of the passivation layer can be improved. Therefore, the reliability or performance of the metal-insulator-metal capacitor can be improved. For example, the resistance problem can be improved, high breakdown voltage can be achieved, long time dependent dielectric breakdown (TDDB) can be achieved, and/or leakage performance (e.g., reduce leakage current) of the MIM capacitor (e.g., by reducing the likelihood that one or more electrons tunnels through the capacitor insulator structure) can be improved. As such, the metal-insulator-metal capacitor can achieve high performance in, for example, surge suppression, element coupling, power conditioning, and/or energy storage.

Based on the above discussions, it can be seen that the present disclosure offers various advantages. It is understood, however, that not all advantages are necessarily discussed herein, and other embodiments may offer different advantages, and that no particular advantage is required for all embodiments. As discussed above, the thickness design in different fashions (e.g., electrode thicknesses decreasing/increasing in the normal direction of the substrate) may be beneficial to reducing the size or realizing miniaturization. Under the design fashion that the electrode thicknesses increasing in the normal direction of the substrate, the reliability or performance of the metal-insulator-metal capacitor can be improved. For example, the resistance problem can be improved, high breakdown voltage can be achieved, long time dependent dielectric breakdown (TDDB) can be achieved, and/or leakage performance (e.g., reduce leakage current) of the MIM capacitor (e.g., by reducing the likelihood that one or more electrons tunnels through the capacitor insulator structure) can be improved. As such, the metal-insulator-metal capacitor can achieve high performance in, for example, surge suppression, element coupling, power conditioning, and/or energy storage.

In accordance with an embodiment, a metal-insulator-metal capacitor includes N electrodes and (N−1) passivation layers, wherein the N electrodes and the (N−1) passivation layers are alternately stacked on a substrate, N is an integer larger than 1, and thicknesses of the N electrodes gradually increase in a direction parallel to a normal direction of the substrate. In an embodiment, the thicknesses of the N electrodes gradually increase in the direction same as the normal direction of the substrate. In an embodiment, the thicknesses of the N electrodes gradually increase in the direction opposite to the normal direction of the substrate. In an embodiment, N is 2 to 10. In an embodiment, the thicknesses of the N electrodes are 10 nm to 100 nm. In an embodiment, the thicknesses of the N electrodes are all different. In an embodiment, N is 5, two most distant electrodes among the N electrodes have different thicknesses, and at least two adjacent electrodes among the N electrodes have the same thickness.

In accordance with another embodiment, an integrated chip includes an interconnect structure overlying a substrate; and a metal-insulator-metal capacitor disposed on the interconnect structure, wherein the metal-insulator-metal capacitor includes N electrodes and (N−1) passivation layers, wherein the N electrodes and the (N−1) passivation layers are alternately stacked on the interconnect structure, N is an integer larger than 1, and thicknesses of the N electrodes gradually increase in a direction parallel to a normal direction of the substrate. In an embodiment, the thicknesses of the N electrodes gradually increase in the direction same as the normal direction of the substrate. In an embodiment, the thicknesses of the N electrodes gradually increase in the direction opposite to the normal direction of the substrate. In an embodiment, N is 2 to 10. In an embodiment, the thicknesses of the N electrodes are 10 nm to 100 nm. In an embodiment, the thicknesses of the N electrodes are all different. In an embodiment, N is 5, two most distant electrodes among the N electrodes have different thicknesses, and at least two adjacent electrodes among the N electrodes have the same thickness.

In accordance with yet another embodiment, an integrated chip includes an interconnect structure overlying a substrate; and a metal-insulator-metal capacitor disposed in the interconnect structure, wherein the metal-insulator-metal capacitor includes N electrodes and (N−1) passivation layers, wherein the N electrodes and the (N−1) passivation layers are alternately stacked in the interconnect structure, N is an integer larger than 1, and thicknesses of the N electrodes gradually increase in a direction parallel to a normal direction of the substrate. In an embodiment, the thicknesses of the N electrodes gradually increase in the direction same as the normal direction of the substrate. In an embodiment, the thicknesses of the N electrodes gradually increase in the direction opposite to the normal direction of the substrate. In an embodiment, N is 2 to 10. In an embodiment, the thicknesses of the N electrodes are 10 nm to 100 nm. In an embodiment, the thicknesses of the N electrodes are all different. In an embodiment, N is 5, two most distant electrodes among the N electrodes have different thicknesses, and at least two adjacent electrodes among the N electrodes have the same thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal capacitor, comprising:
N electrodes and (N−1) passivation layers, wherein the N electrodes and the (N−1) passivation layers are alternately stacked on a substrate, N is an integer larger than 2, the N electrodes comprise an $m^{th}$ electrode to an $N^{th}$ electrode sequentially arranged in a direction parallel to a normal direction of the substrate, m is 1 to N−1, a thickness of the $m^{th}$ electrode is smaller than a thickness of the $N^{th}$ electrode, the thickness of the $m^{th}$ electrode is less than or equal to a thickness of the $m+1^{th}$ electrode, and wherein:
a first electrode among the N electrodes is disposed on the substrate,
a first passivation layer among the (N−1) passivation layers is disposed on the first electrode and the substrate, and the first passivation layer has a step region that continuously contacts and extends from a top surface of the first electrode to sidewalls of the first electrode, and a second electrode among the N electrodes is disposed on the first passivation layer, and the second electrode has a step region that continuously contacts and extends from a top surface of the first passivation layer to sidewalls of the first passivation layer.

2. The metal-insulator-metal capacitor as claimed in claim 1, wherein the $m^{th}$ electrode to the $N^{th}$ electrode are sequentially arranged in the normal direction of the substrate.

3. The metal-insulator-metal capacitor as claimed in claim 1, wherein the $m^{th}$ electrode to the $N^{th}$ electrode are sequentially arranged in a direction opposite to the normal direction of the substrate.

4. The metal-insulator-metal capacitor as claimed in claim 1, wherein N is 3 to 10.

5. The metal-insulator-metal capacitor as claimed in claim 1, wherein the thicknesses of the N electrodes are 10 nm to 100 nm.

6. The metal-insulator-metal capacitor as claimed in claim 1, wherein the thicknesses of the N electrodes are all different.

7. The metal-insulator-metal capacitor as claimed in claim 1, wherein N is 5, two most distant electrodes among the N electrodes have different thicknesses, and at least two adjacent electrodes among the N electrodes have the same thickness.

8. An integrated chip, comprising:
an interconnect structure overlying a substrate; and
a metal-insulator-metal capacitor disposed on the interconnect structure and comprising:
N electrodes and (N−1) passivation layers, wherein the N electrodes and the (N−1) passivation layers are alternately stacked on the interconnect structure, N is an integer larger than 2, the N electrodes comprise an $m^{th}$ electrode to an $N^{th}$ electrode sequentially arranged in a direction parallel to a normal direction of the substrate, m is 1 to N−1, a thickness of the $m^{th}$ electrode is smaller than a thickness of the $N^{th}$ electrode, the thickness of the $m^{th}$ electrode is less than or equal to a thickness of the $m+1^{th}$ electrode, and wherein:
a first electrode among the N electrodes is disposed on the substrate,
a first passivation layer among the (N−1) passivation layers is disposed on the first electrode and the substrate, and the first passivation layer has a step region that continuously contacts and extends from a top surface of the first electrode to sidewalls of the first electrode, and
a second electrode among the N electrodes is disposed on the first passivation layer, and the second electrode has a step region that continuously contacts and extends from a top surface of the first passivation layer to sidewalls of the first passivation layer.

9. The integrated chip as claimed in claim 8, wherein the $m^{th}$ electrode to the $N^{th}$ electrode are sequentially arranged in the normal direction of the substrate.

10. The integrated chip as claimed in claim 8, wherein the $m^{th}$ electrode to the $N^{th}$ electrode are sequentially arranged in a direction opposite to the normal direction of the substrate.

11. The integrated chip as claimed in claim 8, wherein N is 3 to 10.

12. The integrated chip as claimed in claim 8, wherein the thicknesses of the N electrodes are 10 nm to 100 nm.

13. The integrated chip as claimed in claim 8, wherein the thicknesses of the N electrodes are all different.

14. The integrated chip as claimed in claim 8, wherein N is 5, two most distant electrodes among the N electrodes have different thicknesses, and at least two adjacent electrodes among the N electrodes have the same thickness.

15. An integrated chip, comprising:
an interconnect structure overlying a substrate; and
a metal-insulator-metal capacitor disposed in the interconnect structure and comprising:
N electrodes and (N−1) passivation layers, wherein the N electrodes and the (N−1) passivation layers are alternately stacked in the interconnect structure, N is an integer larger than 2, the N electrodes comprise an $m^{th}$ electrode to an $N^{th}$ electrode sequentially arranged in a direction parallel to a normal direction of the substrate, m is 1 to N−1, a thickness of the $m^{th}$ electrode is smaller than a thickness of the $N^{th}$ electrode, the thickness of the $m^{th}$ electrode is less than or equal to a thickness of the $m+1^{th}$ electrode, and wherein:
a first electrode among the N electrodes is disposed on the substrate,
a first passivation layer among the (N−1) passivation layers is disposed on the first electrode and the substrate, and the first passivation layer has a step region that continuously contacts and extends from a top surface of the first electrode to sidewalls of the first electrode, and
a second electrode among the N electrodes is disposed on the first passivation layer, and the second electrode has a step region that continuously contacts and extends from a top surface of the first passivation layer to sidewalls of the first passivation layer.

16. The integrated chip as claimed in claim 15, wherein the $m^{th}$ electrode to the $N^{th}$ electrode are sequentially arranged in the normal direction of the substrate.

17. The integrated chip as claimed in claim 15, wherein N is 3 to 10.

18. The integrated chip as claimed in claim 15, wherein the thicknesses of the N electrodes are 10 nm to 100 nm.

19. The integrated chip as claimed in claim 15, wherein the thicknesses of the N electrodes are all different.

20. The integrated chip as claimed in claim 15, wherein N is 5, two most distant electrodes among the N electrodes have different thicknesses, and at least two adjacent electrodes among the N electrodes have the same thickness.

* * * * *